United States Patent
Baek

(10) Patent No.: US 10,390,420 B2
(45) Date of Patent: Aug. 20, 2019

(54) METHOD OF DYNAMIC THERMAL MANAGEMENT

(71) Applicant: SAMSUNG ELECTRONICS CO., LTD., Suwon-si, Gyeonggi-Do (KR)

(72) Inventor: In Hwan Baek, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/860,519

(22) Filed: Jan. 2, 2018

(65) Prior Publication Data

US 2018/0199424 A1 Jul. 12, 2018

(30) Foreign Application Priority Data

Jan. 10, 2017 (KR) .................. 10-2017-0003447

(51) Int. Cl.
| | | |
|---|---|---|
| *H05K 1/02* | (2006.01) | |
| *H01L 23/34* | (2006.01) | |
| *H01L 21/66* | (2006.01) | |
| *G06F 1/3203* | (2019.01) | |
| *G06F 1/20* | (2006.01) | |
| *G06F 1/324* | (2019.01) | |

(52) U.S. Cl.
CPC ........... *H05K 1/0203* (2013.01); *G06F 1/206* (2013.01); *G06F 1/3203* (2013.01); *G06F 1/324* (2013.01); *H01L 22/00* (2013.01); *H01L 23/34* (2013.01)

(58) Field of Classification Search
None
See application file for complete search history.

(56) References Cited

U.S. PATENT DOCUMENTS

| | | | | |
|---|---|---|---|---|
| 6,901,524 B2* | 5/2005 | Watts, Jr. | ................ | G06F 1/206 713/320 |
| 7,574,321 B2* | 8/2009 | Kernahan | .............. | G01K 7/425 702/136 |
| 8,374,730 B2* | 2/2013 | Conroy | ................... | G06F 1/206 361/679.02 |
| 8,397,088 B1* | 3/2013 | Ghose | ................... | G06F 1/3206 713/300 |
| 9,032,223 B2* | 5/2015 | Rotem | .................... | G06F 1/206 713/300 |
| 9,170,631 B2* | 10/2015 | Naffziger | .............. | G06F 1/3206 |
| 9,436,245 B2* | 9/2016 | Bhandaru | ................. | G06F 1/26 |
| 10,061,331 B2* | 8/2018 | Saeidi | .................... | G05B 15/02 |
| 2006/0095807 A1* | 5/2006 | Grochowski | ........... | G06F 1/206 713/324 |
| 2007/0061021 A1* | 3/2007 | Cohen | .................. | G05B 13/026 700/30 |
| 2007/0244676 A1* | 10/2007 | Shang | ................. | G06F 17/5018 703/2 |

(Continued)

*Primary Examiner* — Ramesh B Patel
(74) *Attorney, Agent, or Firm* — Volentine, Whitt & Francos, PLLC

(57) ABSTRACT

A method of dynamic thermal management includes measuring a current temperature of a first device, calculating an allowable power using the current temperature, deriving an allowable frequency corresponding to the current temperature and the allowable power using first data, and modifying an operating frequency of the first device with the allowable frequency. The first data is a data related to a first group to which the first device belongs, and the first data includes power values corresponding to temperature and frequency.

18 Claims, 15 Drawing Sheets

(56) References Cited

U.S. PATENT DOCUMENTS

| | | | |
|---|---|---|---|
| 2008/0028778 A1* | 2/2008 | Millet | G06F 1/206 |
| | | | 62/129 |
| 2013/0046999 A1* | 2/2013 | Jung | G06F 1/206 |
| | | | 713/300 |
| 2014/0245032 A1* | 8/2014 | Vadakkanmaruveedu | |
| | | | G06F 1/203 |
| | | | 713/300 |
| 2015/0188861 A1* | 7/2015 | Esplin | H04L 51/06 |
| | | | 709/206 |
| 2015/0331433 A1* | 11/2015 | Naffziger | G05B 15/02 |
| | | | 700/300 |
| 2015/0346798 A1* | 12/2015 | Dongara | G06F 1/3206 |
| | | | 713/320 |
| 2016/0034009 A1* | 2/2016 | Wang | G06F 1/206 |
| | | | 713/300 |
| 2016/0062422 A1* | 3/2016 | Mittal | G06F 1/3234 |
| | | | 713/320 |
| 2016/0187897 A1* | 6/2016 | Peng | G06F 1/206 |
| | | | 700/299 |
| 2017/0220445 A1* | 8/2017 | Cunningham | G06F 11/3409 |

* cited by examiner

FIG. 6

| Level | Group Frequency | Group 1 | Group 2 | Group 3 | Group 4 | Group 5 |
|---|---|---|---|---|---|---|
| L3 | 2574MHz | 5531.8mw | 5614.2mw | 5922.0mw | 6148.8mw | 6246.5mw |
| L4 | 2496MHz | 5124.3mw | 5527.4mw | 5622.7mw | 5713.4mw | 5934.8mw |
| L5 | 2314MHz | 4433.6mw | 4504.1mw | 4768.5mw | 4850.6mw | 5049.4mw |
| L6 | 2158MHz | 3846.1mw | 3909.5mw | 4140.9mw | 4223.6mw | 4301.3mw |
| L13 | 650MHz | 431.1mw | 442.6mw | 468.6mw | 483.3mw | 498.9mw |

FIG. 10

③ ALLOWABLE FREQUENCY :2496MHz ( ① Group 4
② ALLOWABLE POWER :5800mw )

| Level | Group<br>Frequency | Group 1 | Group 2 | Group 3 | Group 4 | Group 5 |
|---|---|---|---|---|---|---|
| L3 | 2574MHz | 5531.8mw | 5614.2mw | 5922.0mw | 6148.8mw | 6246.5mw |
| L4 | 2496MHz | ~~5124.3mw~~ | ~~5527.4mw~~ | ~~5622.7mw~~ | 5713.4mw | 5934.8mw |
| L5 | 2314MHz | 4433.6mw | 4504.1mw | 4768.5mw | 4850.6mw | 5049.4mw |
| L6 | 2158MHz | 3846.1mw | 3909.5mw | 4140.9mw | 4223.6mw | 4301.3mw |
| L13 | 650MHz | 431.1mw | 442.6mw | 468.6mw | 483.3mw | 498.9mw |

METHOD OF DYNAMIC THERMAL MANAGEMENT

CROSS-REFERENCE TO RELATED APPLICATION

A claim of priority under 35 U.S.C. § 119 is made to Korean Patent Application No. 10-2017-0003447 filed on Jan. 10, 2017 in the Korean Intellectual Property Office, the entire contents of which are hereby incorporated by reference.

BACKGROUND

The inventive concepts described herein relate to a method of dynamic thermal management.

Generally, a semiconductor device such as a package or a chip is provided with a temperature protecting function that adjusts an operating frequency of the device according to temperature. The principle of such temperature protecting function is to lower temperature of the device by reducing operating frequency when the device reaches a specific temperature.

According to this process, since operating frequency is closely related with performance of the semiconductor device, it is important to adjust the operating frequency so that the semiconductor device accomplishes maximum performance.

A temperature protecting function may be applied by limiting or adjusting operating frequency to a frequency determined per temperature interval. In this case, the overall performance of the device may be standardized downward because rather strict frequency constraints are applied according to temperature, to enable operation of a device having a poorest power characteristic from among devices of the same type.

Accordingly, a method is necessary which can provide proper temperature protection while achieving maximum performance of a semiconductor device.

SUMMARY

Embodiments of the inventive concept provide a method of dynamic thermal management which can achieve maximum performance of devices.

Embodiments of the inventive concept provide a method of dynamic thermal management (DTM) including measuring a current temperature of a first device; calculating an allowable power using the current temperature; deriving an allowable frequency corresponding to the current temperature and the allowable power using first data, wherein the first data is data related to a first group to which the first device belongs, and the first data includes power values of the first group corresponding to temperature and frequency; and modifying an operating frequency of the first device with the allowable frequency.

Embodiments of the inventive concept further provide a method of dynamic thermal management including calculating an allowable power using a deviation between a current temperature of a first device and a target temperature, wherein the first device belongs to a first group among a plurality of groups which are previously classified according to power characteristics; deriving an allowable frequency corresponding to the allowable power and the current temperature, wherein the allowable frequency is derived using previously stored data of the first group; and modifying an operating frequency of the first device with the allowable frequency.

Embodiments of the inventive concept still further provide a method of dynamic thermal management including calculating first and second allowable power respectively using a first current temperature of a first device and a second current temperature of a second device, wherein the first and second allowable power are calculated using a same method, the first and second devices are of a same device type, and the first and second devices belong to first and second groups which are different from each other; deriving a first allowable frequency corresponding to the first allowable power using a first power table, wherein the first power table includes frequency corresponding to power of the first device in the first group; deriving a second allowable frequency corresponding to the second allowable power using a second power table different from the first power table, wherein the second power table includes frequency corresponding to power of the second device in the second group; and modifying frequencies of the first and second devices with the first and second allowable frequencies.

BRIEF DESCRIPTION OF THE DRAWINGS

Embodiments of the inventive concept will be more clearly understood from the following detailed description taken in conjunction with the accompanying figures, and wherein reference numerals refer to like parts throughout the various figures unless otherwise specified.

FIG. 6 illustrates an exemplary power table of a method of dynamic thermal management according to embodiments of the inventive concept.

FIG. 10 illustrates a conceptual view provided as explanation of a process of deriving allowable frequency according to allowable power in a method of dynamic thermal management according to embodiments of the inventive concept.

DETAILED DESCRIPTION

Embodiments of the inventive concept relating to a method of dynamic thermal management will be described with reference to the accompanying figures.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
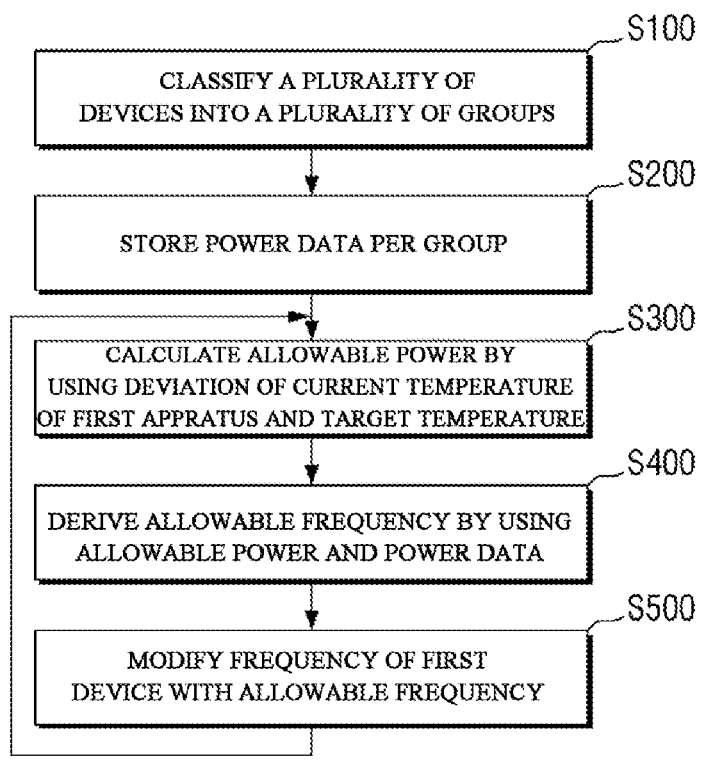
FIG. 1 illustrates a flowchart of a method of dynamic thermal management according to embodiments of the inventive concept.

FIG. 1 illustrates a flowchart of a method of dynamic thermal management according to embodiments of the inventive concept.

Referring to FIG. 1, at S100 a plurality of devices are classified into a plurality of groups.

Figure 2:
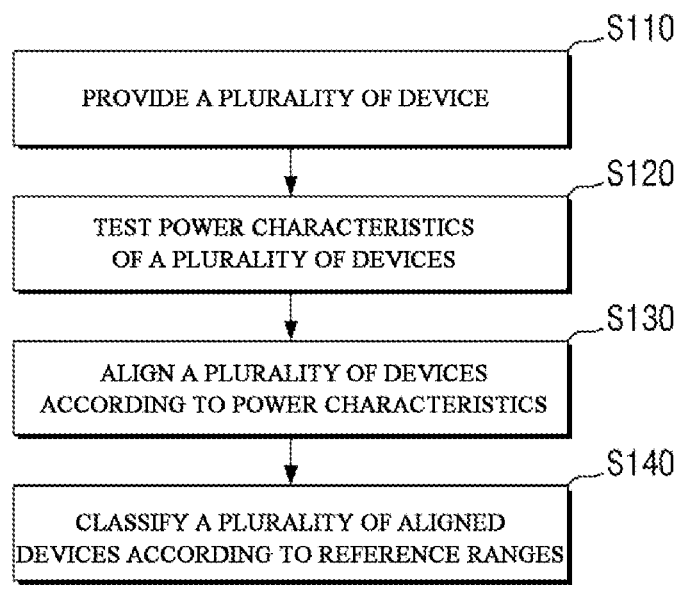
FIG. 2 illustrates a flowchart detailing a classification step of FIG. 1.
Figure 3:
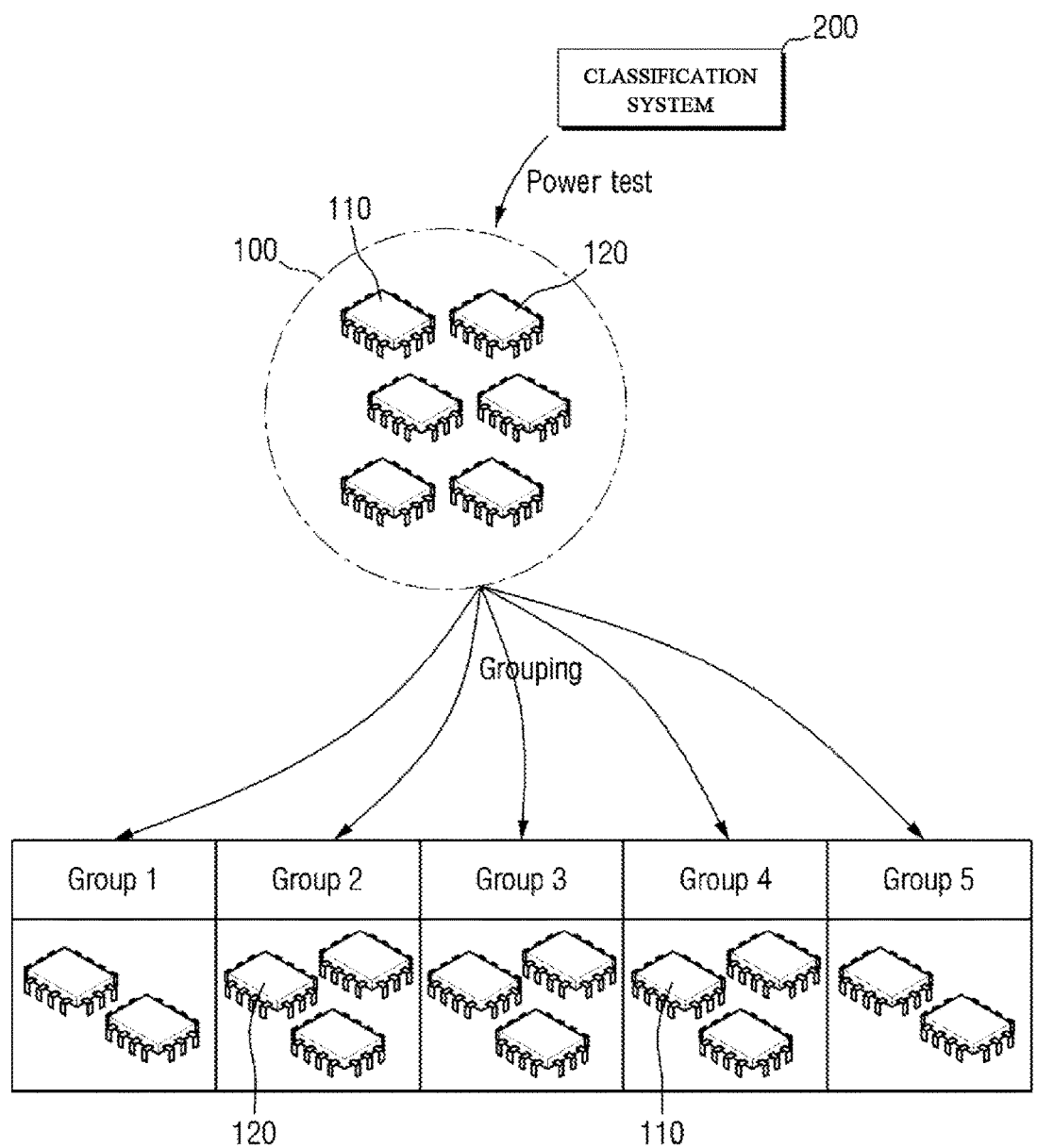
FIG. 3 illustrates a conceptual view provided for explanation of a classification step of a method of dynamic thermal management according to embodiments of the inventive concept.

FIG. 2 illustrates a flowchart detailing the classification step S100 of FIG. 1, according to an embodiment of the inventive concept. FIG. 3 illustrates a conceptual view provided as explanation of the classification step S100 of a method of dynamic thermal management according to embodiments of the inventive concept.

Referring to FIG. 2, first at S110 a plurality of devices 100 are provided.

Specifically, referring to FIG. 3, a plurality of devices 100 may be provided. For example, the plurality of devices 100 may be semiconductor devices. The plurality of devices 100 may be, for example, semiconductor chips, semiconductor packages, or electronic devices that include a semiconductor chip or package therein. The plurality of devices 100 may be devices having an internal clock and capable of operating at varying frequencies (i.e., operating frequencies). Further, many of the plurality of devices 100 may for example be the same device type of devices fabricated by a same process.

Generally, the performance of devices of a same type fabricated by the same or similar processes should ideally be the same. However, the actual performance of devices of the same type may vary from each other due to various reasons or inconsistencies of the fabricating processes. For example, devices formed from different wafers, devices fabricated in a same place but at different positions, or devices of a same device type processed by different equipment may perform similarly, but not precisely the same.

As described above, the plurality of devices 100 may include a first device 110 and a second device 120 which perform differently with respect to each other. As will be explained below, the first device 110 and the second device 120 may have different power characteristics and may be classified into different groups. That is, the first device 110 and the second device 120 may be the same device type, but may have different power characteristics from each other.

Next, returning to FIG. 2, in S120 power characteristics of the plurality of devices 100 are tested.

Referring to FIG. 3, a classification system 200 may refer to, or be part of, an entire system that both fabricates and classifies the plurality of devices 100, but exemplary embodiments of the inventive concept are not limited thereto. For example, in some embodiments the classification system 200 may be provided as a separate system from the fabricating system of the plurality of devices. The classification system 200 may for example include various test equipment of a semiconductor device fabricating process. The test equipment may for example be implemented by and include analog and/or digital circuits such as logic gates, integrated circuits, microprocessors, microcontrollers and memory circuits, electronic components and/or hardwired circuits and the like, and may optionally be driven by firmware and/or software. The test equipment may be implemented by dedicated hardware, or by a processor (e.g., one or more programmed microprocessors and associated circuitry), or by a combination of dedicated hardware to perform various functions.

The classification system 200 may for example test power characteristics of a plurality of devices. That is, the classification system 200 may perform a power test. The power characteristics may refer to the respective power output of each of the plurality of devices 100 tested under a reference condition. The 'reference condition' as used herein may indicate a condition of specific frequency, for example. That is, because each of the plurality of devices 100 may have different power characteristics when operating at a same condition, i.e., at a same frequency, such power characteristics may be tested.

The power characteristics may be represented as a sum obtained by adding static power and dynamic power of each of the plurality of devices 100, for example. The static power may refer to leakage power when a device does not operate, and the dynamic power may refer to additional power consumption that occurs when a device operates.

The static power may be calculated or determined using current, temperature and voltage of each of the plurality of devices 100. However, exemplary embodiments are not limited to the example given above. That is, various methods may be contemplated for calculating the static power of the plurality of devices.

The dynamic power may be calculated or determined using capacitance, voltage, and frequency of each of the plurality of devices 100. However, exemplary embodiments are not limited to the example given above. That is, various methods may be contemplated for calculating the dynamic power.

A total power (measured power) may be determined as the sum of the static power and the dynamic power. The classification system 200 may measure the parameters described above and calculate the total power of each of the plurality devices 100.

Returning to FIG. 2, at S130 the plurality of devices 100 may be aligned according to the power characteristics. The plurality of devices 100 may be aligned by the classification system 200.

Figure 4:
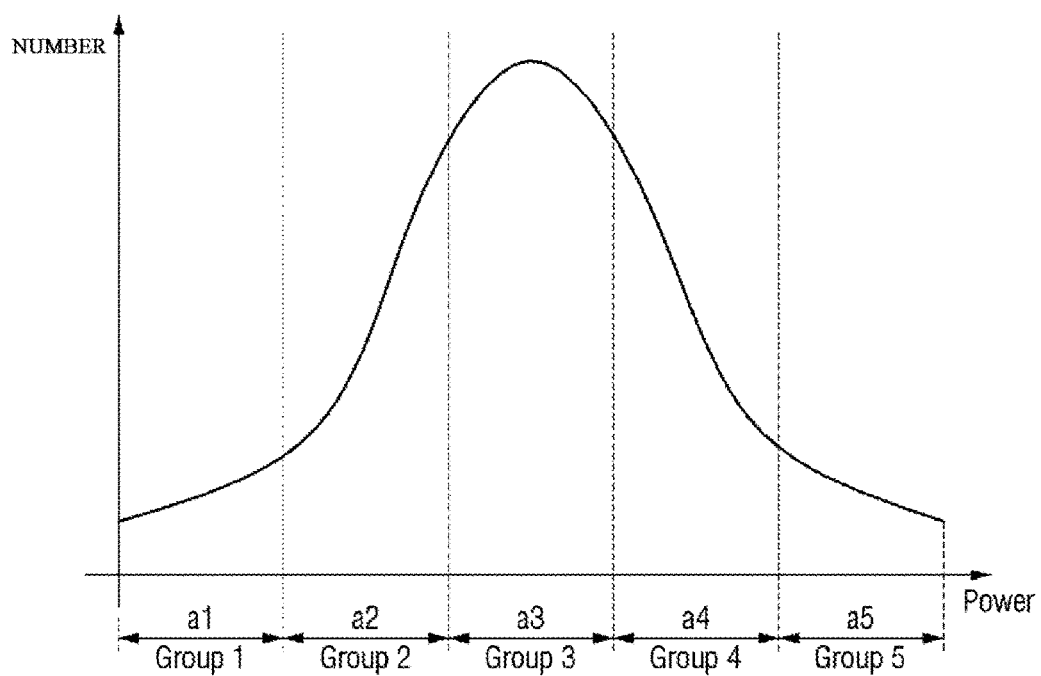
FIG. 4 illustrates an exemplary power distribution graph provided for explanation of a manner of classification in a method of dynamic thermal management according to embodiments of the inventive concept.

FIG. 4 illustrates an exemplary power distribution graph provided as explanation of a manner of classification in a method of dynamic thermal management according to embodiments of the inventive concept. In FIG. 4, the total power as described above is indicated on the x axis, and the number of the devices at a corresponding total power is indicated on the y axis.

Referring to FIG. 4, devices with better power characteristics and devices with poorer power characteristics may be aligned according to test results of the power test. In the graph of FIG. 4, a device having a higher value on the x axis, i.e., a device determined to have higher total power, may be a device with better power characteristics, and conversely a device having a value closer to 0, i.e., a device determined to have lower total power, may be a device with poorer power characteristics.

Next, returning to FIG. 2, at S140 the plurality of aligned devices 100 may be classified according to reference ranges. The plurality of aligned devices 100 may be classified by the classification system 200.

Referring to FIG. 3, the plurality of devices 100 may be classified into five groups including for example Group 1, Group 2, Group 3, Group 4 and Group 5. For example, the first device 110 may be classified in a fourth group (Group 4), and the second device 120 may be classified in a second group (Group 2).

The classification system 200 may classify the plurality of devices 100. The classification system 200 may classify a plurality of devices into a plurality of groups using separate power characteristics of the plurality of devices 100.

FIG. 3 illustrates five groups as an example. However, in other embodiments of the inventive concept the method of dynamic thermal management is not limited to classifying a plurality of devices into five groups. In other embodiments, plurality of devices may be classified into any number of groups greater than or equal to 2.

The plurality of devices 100 may be classified into different groups according to respective power characteristics. For example, the first device 110 may be classified in the fourth group (Group 4), and the second device 120 may be classified in the second group (Group 2).

Referring to FIG. 4, the plurality of devices 100 may be sequentially aligned and classified as the first to fifth groups (Group 1-Group 5). In an example, the first group (Group 1) may be a group of devices having the most inferior power characteristics (i.e., lowest test result) among the plurality of devices 100, and the fifth group (Group 5) may be a group of devices having the most superior power characteristics (i.e., highest test result). Accordingly, power characteristics of the first device 110 as shown in FIG. 3 may be superior to power characteristics of the second device 120.

The first to fifth groups (Group 1-Group 5) may be determined according to reference ranges of power values. For example, the reference ranges of power values for determining the first to fifth groups (Group 1-Group 5) may have equal size with respect to each other.

Specifically, the first group (Group 1) may have a reference range of a first size (a1), the second group (Group 2) may have a reference range of a second size (a2), the third group (Group 3) may have a reference range of a third size (a3), the fourth group (Group 4) may have a reference range of a fourth size (a4), and the fifth group (Group 5) may have a reference range of a fifth size (a5).

For example, all of the first to fifth sizes (a1-a5) may be equal. Accordingly, different numbers of the plurality of devices 100 may be grouped in the first to fifth groups (Group 1-Group 5). Generally, a group positioned at a center location of the x axis (e.g., third group (Group 3) of FIG. 4) may include the largest number of devices, and groups positioned at the ends of the x axis (e.g., first group (Group 1) and fifth group (Group 5) of FIG. 4) may include the least number of devices. However, the grouping may be different depending on the distribution of the power characteristics.

Figure 5:
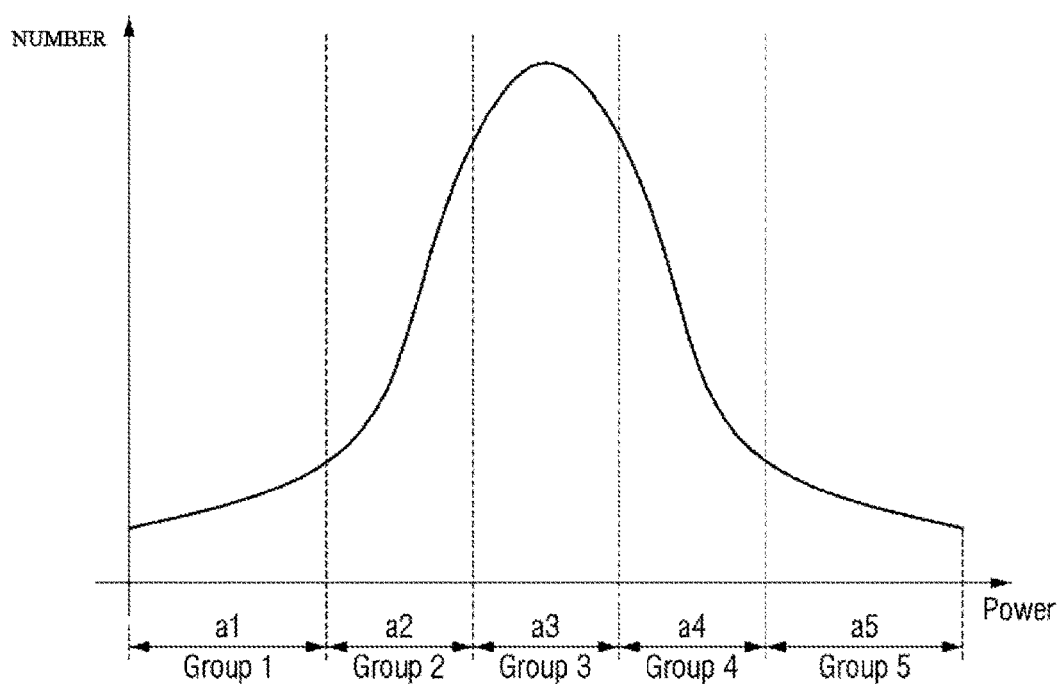
FIG. 5 illustrates an exemplary power distribution graph provided for explanation of a manner of classification in a method of dynamic thermal management according to embodiments of the inventive concept.

FIG. 5 illustrates an exemplary power distribution graph provided as explanation of a manner of classification in a method for dynamic thermal management according to embodiments of the inventive concept. Similar to FIG. 4, in FIG. 5 the total power as is indicated on the x axis, and the number of the devices at a corresponding total power is indicated on the y axis.

Referring to FIG. 5, in a method of dynamic thermal management according to some embodiments of the inventive concept, the reference ranges of the first to fifth groups (Group 1-Group 5) may have different sizes. Specifically, because the first group (Group 1) and the fifth group (Group 5) positioned at the ends of the x axis would inevitably include a relatively less number of devices than the second to fourth groups (Group 2-Group 4), the size of the reference range of the first group (Group 1) and the size of the reference range of the fifth group (Group 5) may be increased so that these groups include therein devices having a broad range of power characteristics.

Conversely, because the second to fourth groups (Group 2-Group 4) have a larger number of devices, the size of the reference ranges of the second to fourth groups (Group 2-Group 4) may be decreased to be smaller than the size of the reference range of the first group (Group 1) and the fifth group (Group 5).

That is, the first size (a1) and the fifth size (a5) may be greater than the second size (a2), the third size (a3) and the fourth size (a4). Accordingly, the intervals (second to fourth groups (Group 2-Group 4)) with a larger number of devices may have classification with more subdivided power characteristics.

Because methods of dynamic thermal management according to some exemplary embodiments of the inventive concept present different temperature protecting functions according to respective groups of the devices, a more precise temperature protecting function may be performed as the number of groups and the size of the intervals of the group decrease.

Next, returning to FIG. 1, after classifying the plurality of devices 100 into a plurality of groups in S100, at S200 the power data per group may be stored. The power data may stored by the classification system 200.

FIG. 6 illustrates an exemplary power table of a method of dynamic thermal management according to embodiments of the inventive concept. Specifically, referring to FIG. 6, power values according to frequency may be stored per group. Such power values may be stored as a power table in a form illustrated in FIG. 6. However, storage of power values is not limited to the form shown in FIG. 6, and in other embodiments the power data may be stored in other forms instead of table form.

The power table as shown in FIG. 6 may include temperature protection levels. That is, the power table may have corresponding levels according to temperature. That is, levels L1-L13 in FIG. 6 may be temperature levels. For example, when a temperature of a device is 85° C., a third level (L3) may be designated which corresponds to a frequency of 2,574 Mhz. Relations between temperature and frequency may be previously designated. For example, in embodiments of the inventive concept, the power table may include first data (power data) related to devices of a first group (i.e., Group 4) to which the first device 110 belongs, and the first data may include data corresponding to temperature and frequency of the first group.

In general, a related method of dynamic thermal management may be configured to apply the same frequency constraint at the same level for the same device type without considering characteristics of each of a plurality of devices. That is, although first to fifth groups (Group 1-Group 5) of devices may each have different power characteristics respectively, a related method of dynamic thermal management may apply a uniform frequency constraint on each of the first to fifth groups without consideration of the different power characteristics.

For example, in a related method the first device 110 and the second device 120 respectively belonging to the fourth group (Group 4) and the second group (Group 2) may both have operating frequencies limited to 2,574 Mhz when the third level (L3) is designated.

In the related method in this case, a rather conservative frequency constraint is applied to ensure that all of the plurality of devices of the same device type operate stably. That is, because a frequency constraint of the related method is designated so that a device having the most inferior power characteristics among a plurality of devices can operate stably, performance of a device having relatively superior power characteristics will inevitably be standardized downward.

In contrast to the related method, methods of dynamic thermal management according to embodiments of the inventive concept may first calculate or determine an allowable power instead of directly calculating a corresponding frequency according to temperature, and may derive an allowable frequency using the calculated result. Further, the allowable power may not be calculated in a batch manner. That is, the allowable power may be calculated for each of a plurality of groups such as the first to fifth groups (Group 1-Group 5), and an optimized frequency having optimized performance of each group may be derived. The overall method will be specifically explained below.

The power table as shown in FIG. 6 may store power values according to frequency corresponding to temperature level. In an example, the power value may be stored per group, as described above.

It should be understood that because each group includes a plurality of devices, in embodiments of the inventive concept a power value stored in the power table may be a representative value of each group. Such a representative value may be any of an average value and a medium value. However, embodiments of the inventive concept are not limited to the above mentioned representative values, and accordingly in other embodiments any representative value reflecting characteristic of each group may be used.

As illustrated in FIG. 6, the power characteristics may be most superior in the fifth group (Group 5), and most inferior in the first group (Group 1). As described above, the five groups are merely exemplary, and accordingly, the number of the groups in actual implementation may be much greater or less.

Likewise, the number of levels indicated in FIG. 6 is 13, but the number of levels should not be limited as shown. In other embodiments, according to the target and purpose of the method of dynamic thermal management, the number of the levels may be variously adjusted.

The power table as shown in FIG. 6 may be generated by the classification system 200 of FIG. 3 and stored in a database. The database will be explained in detail below.

Returning to FIG. 1, at S300 the allowable power is calculated or determined by using a deviation between a current temperature and a target temperature of the first device 110.

Calculating the allowable power may use proportional control.

Figure 7:
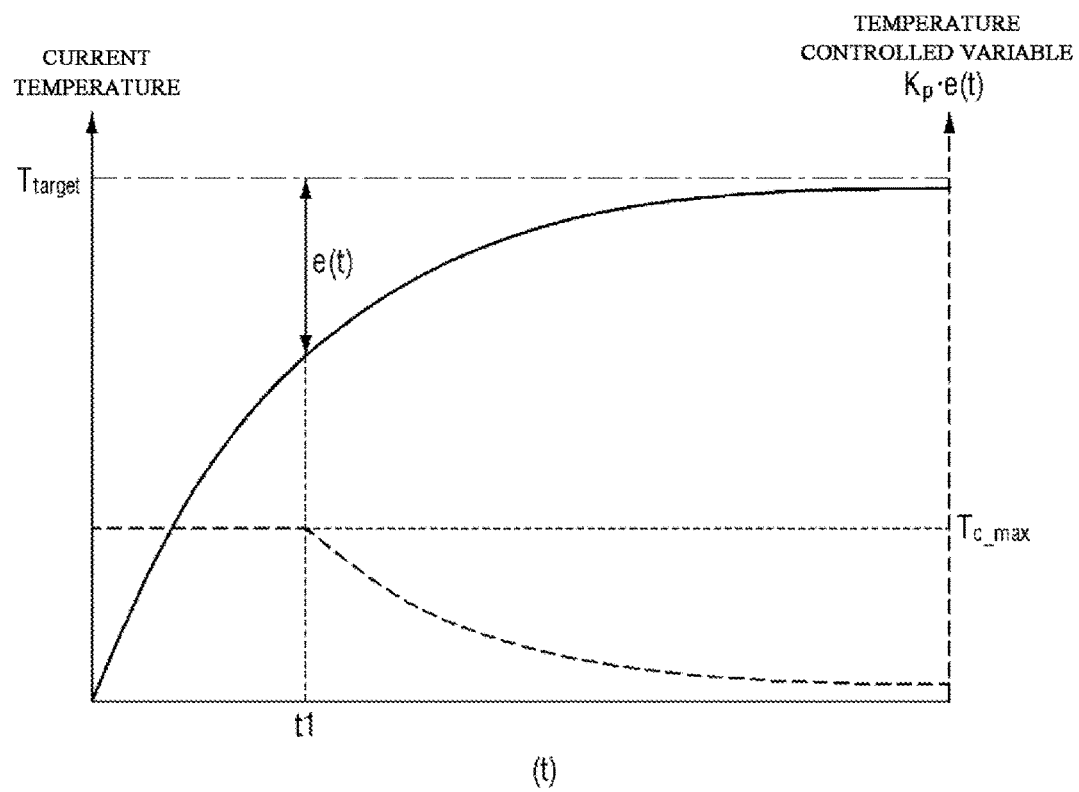
FIG. 7 illustrates an exemplary graph provided as explanation of proportional control for calculating allowable power in a method of dynamic thermal management according to embodiments of the inventive concept.

FIG. 7 illustrates an exemplary graph provided as explanation of proportional control for calculating allowable power in a method of dynamic thermal management according to embodiments of the inventive concept. In FIG. 7, the solid-line curve represents a current temperature of a device, the dashed-line represents a temperature controlled variable, and the x axis represents time (t).

Referring to FIG. 7, the current temperature may be brought to the target temperature $T_{target}$ by using a deviation e(t) between the current temperature and the target temperature $T_{target}$.

When a constantly-controllable maximum value, i.e., maximum manipulation temperature $T_{c\_max}$ is used as a controlled variable instead of using proportional control, the control may be OFF if the current temperature drops under the target temperature $T_{target}$, and the control may be ON if the current temperature rises back above the target temperature $T_{target}$. The above is called 'on/off control'. A disadvantage of on/off control is that, because 100% of the controlled variable is always used, the current temperature cannot stay at a constant value but always fluctuates around the target temperature $T_{target}$.

Conversely, because proportional control uses a deviation e(t) between the target temperature $T_{target}$ and the current temperature, the controlled variable of the current temperature may be reduced as a deviation e(t) decreases. Accordingly, more precise temperature control may be performed.

The temperature controlled variable of the proportional control may be expressed as $K_p e(t)$, where $K_p$ is a proportional control coefficient, and e(t) is a deviation between the current temperature and the target temperature $T_{target}$.

When the proportional control coefficient $K_p$ is increased, overshoot increases but the duration of time from the rise time to the initial overshoot decreases. That is, the expression '$K_p$ is increased' means that the control is performed with a larger controlled variable according to deviation e(t). Accordingly, it is possible to reach close to a target value (i.e., the target temperature $T_{target}$) relatively fast, while reducing steady state errors.

For example, 'steady state' refers to a state close to the target temperature $T_{target}$, and the time for arriving at the steady state is referred to as a 'settling time'.

However, a large controlled variable may literally overburden the entire system. Conversely, when the proportional control coefficient $K_p$ is small, the controlled variable of a deviation e(t) is small, and it is thus possible to reach close to a target value (i.e., the target temperature $T_{target}$) while controlling the controlled variable slowly. Accordingly, overshoot may be reduced, but the time necessary to arrive at the target value may increase.

Such a value of a proportional control coefficient $K_p$ may be determined with a method described below.

First, a proportional control coefficient $K_{pu}$ for a value lower than (i.e., under) the target temperature $T_{target}$ may be determined.

A temperature increase $\Delta t$ according to time is obtained from a maximum value of frequencies of the plurality of devices 100, and $K_{po}$ is designated so that a temperature from which $T_{target}$-$\Delta t$ is obtained becomes a first reference temperature, i.e., a temperature of a first level (L1) in the power table in FIG. 6.

Next, a proportional control coefficient $K_{po}$ for a value higher than (i.e., over) the target temperature $T_{target}$ is determined.

Because power increases exponentially while frequency increases linearly, for a temperature higher than the target temperature $T_{target}$, a coefficient is designated, which can lower the frequency level by level in the power table in FIG. 6 per 1° C.

The method described above is merely an example of designating an optimized proportional control coefficient according to an embodiment of the inventive concept, and other embodiments are not limited to designating an optimized proportional control coefficient as described above. That is, in this embodiment a (first) allowable power may be calculated by multiplying a proportional control coefficient by the deviation e(t) between the current temperature and the target temperature $T_{target}$.

In the method for dynamic thermal management according to some embodiments of the inventive concept, calculation of the allowable power may involve use of the proportional control and integral control.

Figure 8:
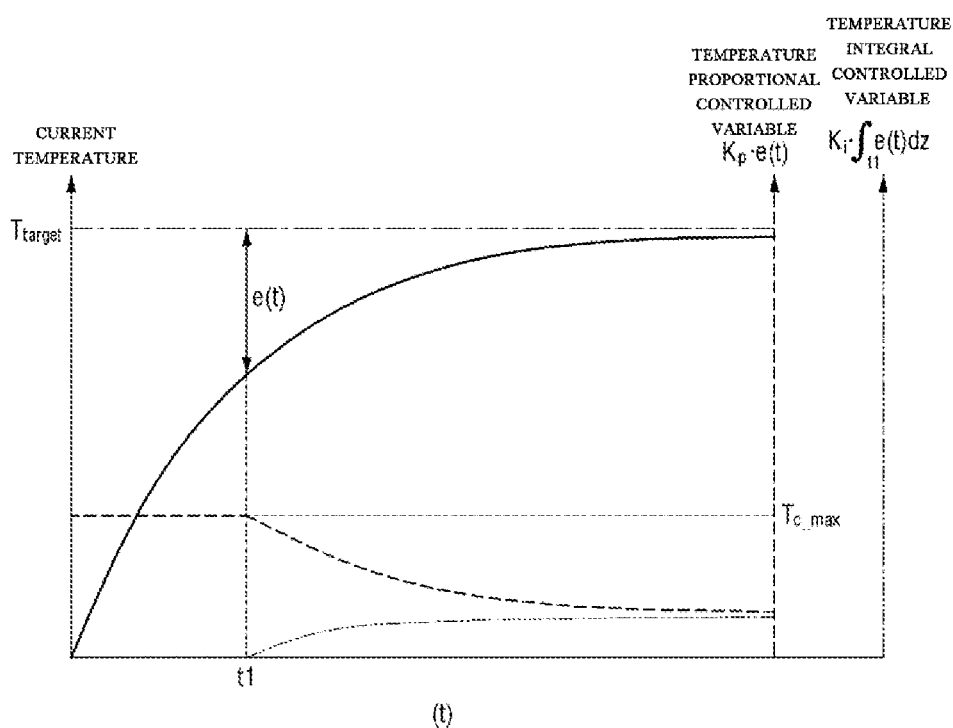
FIG. 8 illustrates an exemplary graph provided as explanation of proportional control and integral control for calculating allowable power in a method of dynamic thermal management according to embodiments of the inventive concept.

FIG. 8 illustrates an exemplary graph provided as explanation of proportional control and integral control for calculating allowable power in a method of dynamic thermal management according to some embodiments of the inventive concept. In FIG. 8, the solid-line curve represents a current temperature, the dashed-line represents a temperature proportional controlled variable, the dotted-dashed-line represents a temperature integral controlled variable, and the x axis represents time (t).

Referring to FIG. 8, the method of dynamic thermal management according to some embodiments may use integral control in addition to the proportional control described above.

When the proportional control is used without using integral control, settling time remains the same irrespective of a size of a proportional control coefficient $K_p$. However, a deviation e(t) may not be completely removed with the proportional control alone.

When the current temperature is brought to the steady state near the target temperature $T_{target}$ with the proportional control, integration may be performed with a time value with respect to an accumulated residual deviation with a presence of the remaining residual deviation, and as a result, the current temperature may be brought more accurately toward the target temperature $T_{target}$.

The temperature controlled variable of the integral control may be expressed as $K_i \int_{t_i}^{\tau} e(\tau) d\tau$, where $K_i$ is an integral control coefficient.

When the integral control coefficient $K_i$ is increased, overshoot is increased, and accordingly, the arrival time for reaching the target temperature $T_{target}$ is finely decreased. Conversely, when the integral control coefficient $K_i$ is decreased, overshoot is decreased, and accordingly the arrival time for reaching the target temperature $T_{target}$ is increased.

When the integral control is performed, the steady state errors attributable to the proportional control may be removed, but the settling time may be increased. That is, as $K_i$ is increased, the settling time is further increased because the overshoot and undershoot are increased.

Such an integral control coefficient $K_i$ may be determined with a method described below.

When the current temperature is increased or decreased during an operation from a temperature close to the target temperature $T_{target}$, at least one frequency level of FIG. 6 may be modified, but an integral control coefficient value may be determined with a value that cannot arrive at a maximum frequency.

Thus, in this embodiment the allowable power is calculated by adding a (first) allowable power calculated by multiplying a proportional control coefficient by the deviation e(t) between the current temperature and the target temperature $T_{target}$, and a (second) allowable power calculated by multiplying an integration value of the deviation e(t) accumulated according to time by an integral control coefficient.

The method described above is an example of designating an optimized integral control coefficient according to an embodiment of the inventive concept, and other embodiments of the inventive concept are not limited to designating an optimized integral control coefficient as described above.

Further, with respect to an integral control coefficient, because the control should operate at steady state, a maximum value of an integral controlled variable may be necessarily designated previously. As a result, an accumulated value that exceeds a certain size may be designated so that the value is not used in the integral control.

In a method of dynamic thermal management according to some embodiments of the inventive concept, calculation of the allowable power may use the proportional control and derivative control.

Figure 9:
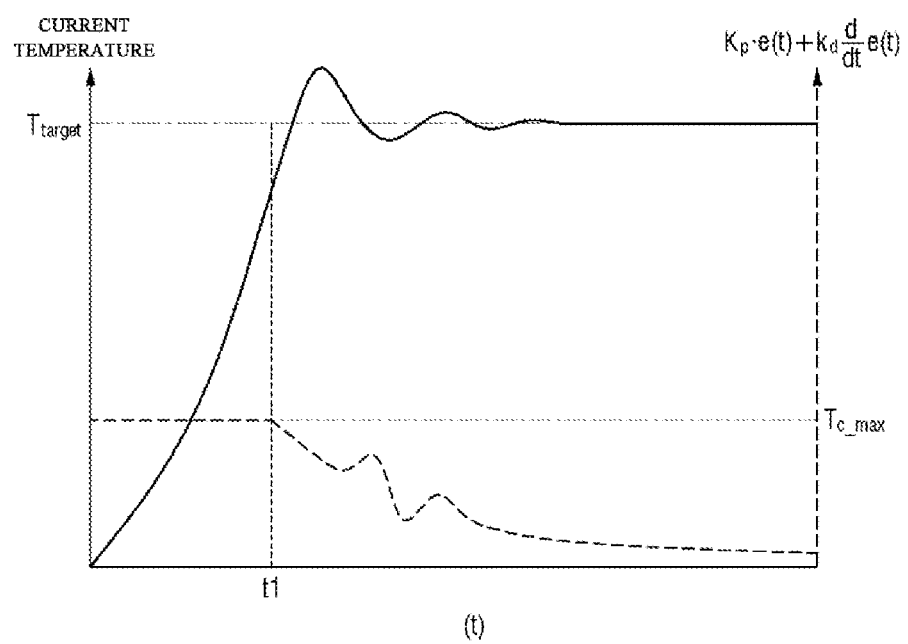
FIG. 9 illustrates an exemplary graph provided as explanation of proportional control and derivative control for calculating allowable power in a method of dynamic thermal management according to embodiments of the inventive concept.

FIG. 9 illustrates an exemplary graph provided as explanation of proportional control and derivative control for calculating allowable power in a method of dynamic thermal management according to embodiments of the inventive concept. In FIG. 9, the solid-line curve represents a current temperature, the dashed-line curve represents a temperature proportional and derivative controlled variable, and the x axis represents time (t).

Referring to FIG. 9, a method of dynamic thermal management according to some exemplary embodiments of the inventive concept may use derivative control in addition to the proportional control.

When derivative control is not used, i.e., when the proportional control alone is used, or when only the proportional control and the integral control are used, reaction speed may be slowed in the case of occurrence of a disturbance.

The derivative control method compares a deviation e(t) between the target temperature $T_{target}$ and the current temperature, and provides a controlled variable of a gradient opposite to a deviation e(t). In other words, when a deviation e(t) from the target temperature $T_{target}$ is +10, a gradient of −10 is applied as the controlled variable.

Accordingly, even when a disturbance abruptly occurs in the proportional control and the integral control, it can be stabilized quickly again by the comparison of a deviation between the disturbance and the target temperature.

The temperature controlled variable of the derivative control may be expressed as $$K_d \frac{d}{dt} e(t),$$

where $K_d$ is a derivative control coefficient.

Because time for stabilizing is decreased first as a derivative control coefficient $K_d$ is increased, settling time may be reduced. However, at steady state, the proportional control and the integral control have greater effects than the derivative control, and accordingly, there is little steady state deviation variation.

In examples of the proportional control and the derivative control that compare a deviation from the target temperature, a higher value coefficient can increase overshoot while reducing the arrival time. However, with the derivative control that compares a deviation e(t) from the target temperature $T_{target}$ and provides a manipulated variable with an opposite gradient, a deviation e(t) can be derived more quickly as $K_d$ is increased.

Accordingly, when the derivative control coefficient $K_d$ is increased, overshoot is decreased, arrival time for reaching the target temperature $T_{target}$ is also decreased, and settling time is also decreased, which is different from the proportional control and integral control. Conversely, if the derivative control coefficient $K_d$ is small, a deviation e(t) is derived more slowly and accordingly, overshoot is increased, arrival time for reaching the target temperature $T_{target}$ is also increased, and settling time is also increased.

Thus, in this embodiment the allowable power is calculated by adding a (first) allowable power calculated by multiplying a proportional control coefficient by the deviation e(t) between the current temperature and the target temperature $T_{target}$, and a (third) allowable power calculated by multiplying a gradient according to time of the deviation e(t) by a derivative control coefficient.

Further, boundary parameters may be additionally determined so as to prevent malfunction generated due to excessive accumulation at low temperature. The boundary parameters may include, for example, a minimum value of an integral controlled variable, a threshold value of a reset, and a cutoff integration value, among other possible boundary parameters.

The proportional control, the integral control, and the derivative control may also be referred to as P (proportional) I (integral) D (derivative) control, respectively. Accordingly, a method of dynamic thermal management according to some exemplary embodiments of the inventive concept may apply any of the P control (i.e., proportional control), the PI control (i.e., proportional integral control), the PD control (i.e., proportional derivative control) and the PID control (i.e., proportional integral derivative control). However, other exemplary embodiments of the inventive concept are not limited to the example control described above.

That is, a method of dynamic thermal management according to some exemplary embodiments may calculate the allowable power according to any of the methods described above. For example, in a further embodiment of the inventive concept, the allowable power may be calculated by adding a (first) allowable power calculated by multiplying a proportional control coefficient by the deviation e(t) between the current temperature and the target temperature $T_{target}$, a (second) allowable power calculated by multiplying an integration value of the deviation e(t) accumulated according to time by an integral control coefficient, and a (third) allowable power calculated by multiplying a gradient according to time of the deviation e(t) by a derivative control coefficient.

Returning again to FIG. 1, at S400 the allowable frequency is derived by using the allowable power and the power data stored at S200.

FIG. 10 illustrates a conceptual view provided as explanation of a process of deriving allowable frequency according to allowable power in a method of dynamic thermal management according to embodiments of the inventive concept.

Referring to FIG. 10, a corresponding allowable frequency is found by using the group of the first device 110 and the allowable power. First, as indicated by ① in FIG. 10, because the first device 110 is in the fourth group (Group 4), proper power is found from columns of the fourth group (Group 4) in the power table. In an example, power of a value smaller than, but closest to the allowable power is found.

For example, as indicated by ② in FIG. 10, 5,713.4 mW is the power that is smaller than, and closest to the allowable power 5,800 mW. Accordingly, as indicated by ③ in FIG. 10, 2,496 MHz of a fourth level (L4) corresponding to 5,713.4 mW may be derived as the allowable frequency. That is, power exceeding the allowable power may prevented, by selecting a frequency corresponding to power lower than the allowable power as the allowable frequency.

Returning again to FIG. 1, at S500 a frequency (i.e., operating frequency) of the first device 110 is modified with the allowable frequency. For example, an operating frequency of the first device 110 is modified to the allowable frequency.

Accordingly, temperature of the first device 110 may be adjusted close to the target temperature. This is because when frequency of operation of the first device 110 is limited to the allowable frequency, heat generation is adjusted accordingly and the temperature is adjusted.

The current temperature in the method of dynamic thermal management according to some exemplary embodiments of the inventive concept may be continuously renewed in real time. Accordingly, the allowable power may be calculated again at S300 by using the current temperature which is newly modified.

As a result, the allowable frequency may be newly derived at S400, and a frequency (i.e., an operating frequency) of the first device 110 may be modified with the newly-derived allowable frequency at S500. That is, processes at S300, S400, and S500 may iterate continuously and dynamically, and as a result, the current temperature may gradually be brought close to the target temperature.

Figure 11:
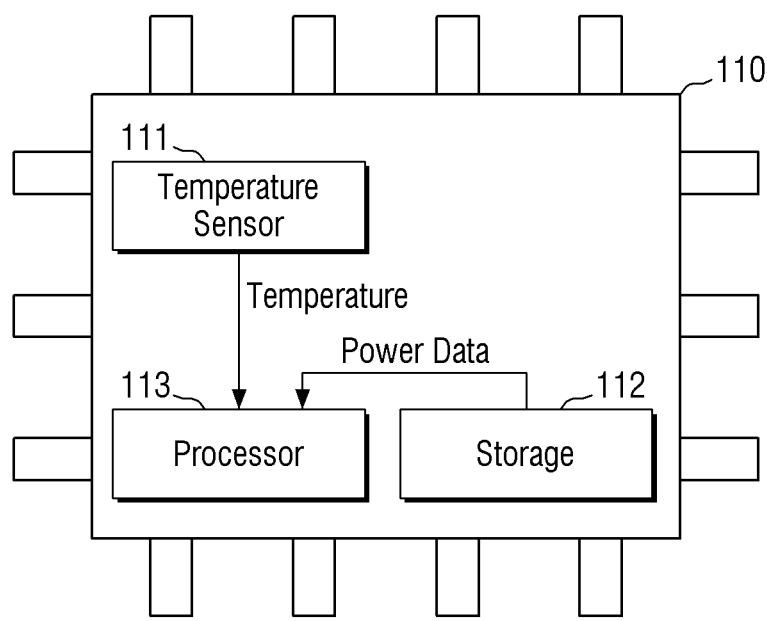
FIG. 11 illustrates a block view diagram of a structure of a separate device in a method of dynamic thermal management according to embodiments of the inventive concept.

FIG. 11 illustrates a block diagram of a structure of a separate device usable in a method of dynamic thermal management according to embodiments of the inventive concept.

Referring to FIG. 11, the first device 110 as initially described with respect to FIG. 3 may include a temperature sensor 111, a processor 113, and storage 112.

The temperature sensor 111 measures the current temperature of the first device 110. The temperature sensor 111 may deliver the current temperature of the first device 110 (Temperature) to the processor 113 in real time. The processor 113 may perform a method of dynamic thermal management as described with respect to FIGS. 1-10 using the current temperature.

The storage 112 stores the power data. The storage 112 may store information identifying which group the first device 110 belongs, and the power data of the group to which the first device 110 belongs (e.g., Group 4 as shown in FIG. 3). For example, the power data may include a power table such as shown in FIG. 6. The storage 112 may transmit the power data to the processor 113 (Power Data). As a result, the processor 113 may derive the allowable frequency.

The power data may also include the target temperature. Accordingly, the processor 113 may calculate the allowable power by using a deviation between the current temperature and the target temperature. Further, the power data may include the proportional control coefficient, the integral control coefficient, the derivative control coefficient, and other boundary parameters described above.

The processor 113 may receive the current temperature transmitted from the temperature sensor 111. Further, the processor 113 may receive the power data including the target temperature and the power table transmitted from the storage 112.

The processor 113 may calculate or determine the allowable power by using a deviation between the target temperature and the current temperature, derive the allowable frequency by using the allowable power and the power table, and modify a frequency of the first device 110 with the allowable frequency.

Because the temperature sensor 111 provides the current temperature to the processor 113 in real time, the processor 113 may continuously iterate the above described operation of frequency modification. As a result, a temperature of the first device 110 may be adjusted dynamically.

Figure 12:
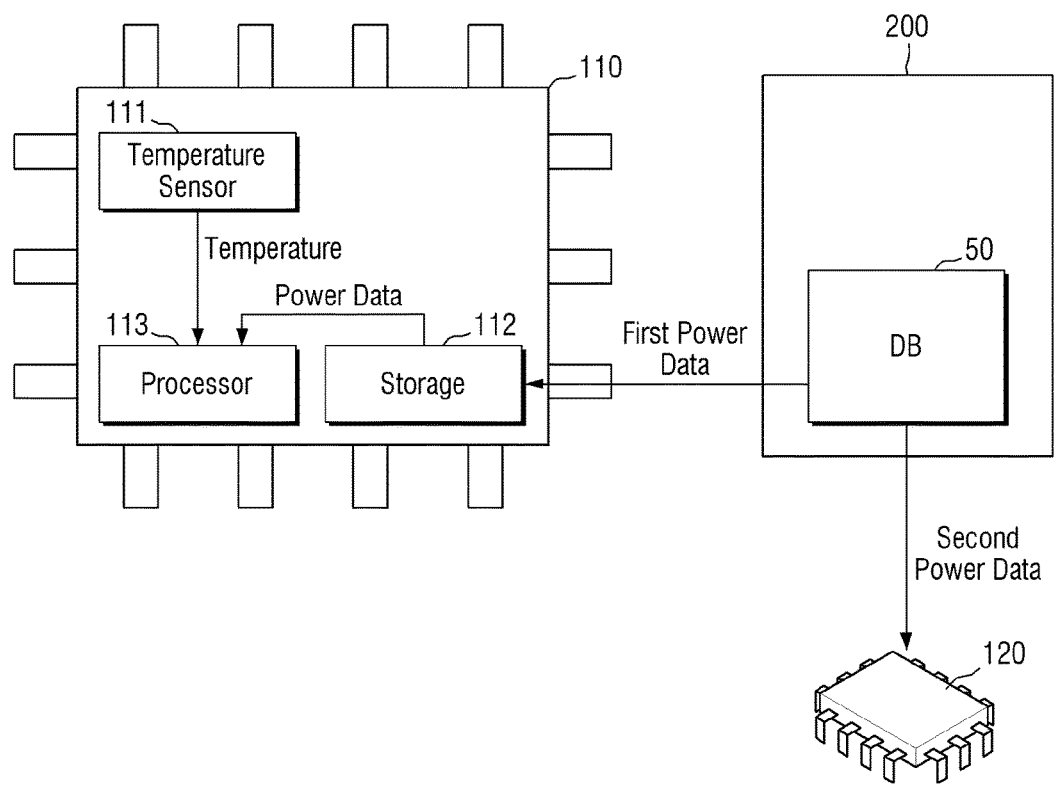
FIG. 12 illustrates a block diagram provided as explanation of a manner in which power data is transmitted in a method of dynamic thermal management according to embodiments of the inventive concept.

FIG. 12 illustrates a block diagram provided as explanation of a manner in which power data is transmitted in a method of dynamic thermal management according to embodiments of the inventive concept.

Referring to FIG. 12, the classification system 200 includes the database (DB) 50. The database 50 may include the power data internally assorted per group. Such power data may include the target temperature and the power table per group.

The power data may include first power data and second power data. The first power data may be the power data related with a group (e.g., fourth group (Group 4)) the first device 110 belongs to, and the second power data may be the power data related with a group (e.g., second group (Group 2)) the second device 120 belongs to.

Although not illustrated, the second power data may be stored in storage of the second device 120. Although the drawings illustrate the first device 110 and the second device 120 only, the database 50 may transmit the power data of each group with respect to all the devices of the plurality of storage devices 100.

While it is described that the first and second power data include the power table of a specific group for convenience of explanation, embodiments of the inventive concepts should not be limited as noted above. That is, in other embodiments both the first and second power data may uniformly include all the power tables of all the groups and also include information relating to which device belongs to which group, so as to include the data for confirming which power data is required by the first device 110 and the second device 120.

Herein below, a method of dynamic thermal management according to some exemplary embodiments will be described with reference to FIG. 13. In the following, description overlapping with embodiments previously described may be omitted for the sake of brevity.

Figure 13:
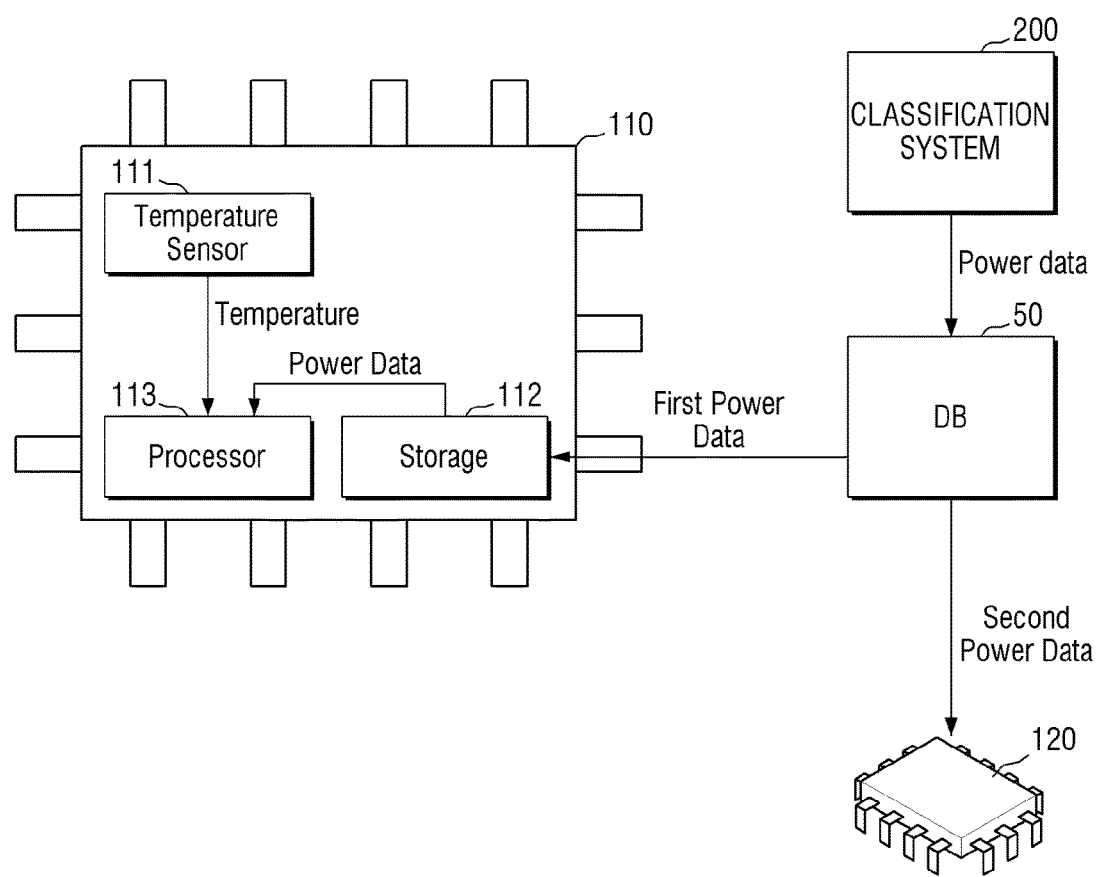
FIG. 13 illustrates a block diagram provided as explanation of a manner in which power data is transmitted in a method of dynamic thermal management according to embodiments of the inventive concept.

FIG. 13 is a block diagram provided as explanation of a manner in which power data is transmitted in a method of dynamic thermal management according to embodiments of the inventive concept.

Referring to FIG. 13, in some embodiments the database 50 may be provided separately from the classification system 200.

That is, the classification system 200 may transmit to the database 50 the power data prepared as a result of power tests previously performed on a plurality of devices. For example, the power data may include data such as data relating to which device belongs to which group, the target temperature, the power tables of respective groups, the proportional control coefficient, the integral control coefficient, the derivative control coefficient, and the respective boundary parameters, among other data.

Next, the database 50 may transmit the first power data and the second power data respectively to the first device 110 and the second device 120. For example, the first power data may include the power table of a group to which the first device 110 belongs, and the second power data may include the power table of a group to which the second device 120 belongs.

Herein below, a method of dynamic thermal management according to embodiments of the inventive concept will be described with reference to FIGS. 10, 11 and 14. In the following, description overlapping with the embodiments previously described may be omitted for the sake of brevity.

Figure 14:
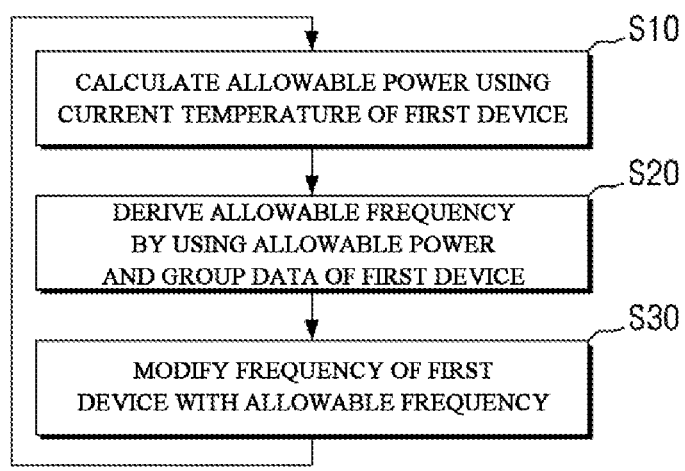
FIG. 14 illustrates a flowchart of a method of dynamic thermal management according to embodiments of the inventive concept.

FIG. 14 illustrates a flowchart of a method of dynamic thermal management according to embodiments of the inventive concept.

Referring to FIG. 14, at S10 the allowable power is calculated using the current temperature of the first device.

Referring to FIG. 11, the current temperature of the first device 110 is measured by the temperature sensor 111, and delivered to the processor 113. Further, the storage 112 may deliver to the processor 113 the power data including the target temperature, the control coefficient and the boundary parameters. The processor 113 may calculate the allowable power by using a deviation between the current temperature and the target temperature, and using the PI, PD, or PID control.

Referring again to FIG. 14, at S20 the allowable frequency corresponding to the current temperature is derived by using the allowable power and the power data (a first data) with respect to a group of the first device. That is, the allowable frequency is derived using previously stored data of the corresponding group.

Referring to FIGS. 10 and 11, the processor 113 may receive the power data including the power table transmitted from the storage 112. The processor 113 may derive the allowable frequency using the power table and the allowable power.

The allowable frequency may be a frequency corresponding to power lower than the allowable power within the power table and closest to the allowable power. For example, the power may be set differently according to groups. Accordingly, because the most optimized allowable frequency may be designated in view of characteristics of the group, the performance at a device having superior power characteristics may be increased to maximum.

Referring again to FIG. 14, at S30 a frequency of the first device is modified with the allowable frequency.

Referring to FIG. 11, the processor 113 may modify the current frequency (i.e., the current operating frequency) with the allowable frequency when the allowable frequency is derived, and accordingly, a temperature of the first device 110 may be brought close to the target temperature.

The processor 113 may continue to iterate S10, S20, and S30 as the current temperature changes thereafter. Accordingly, the current temperature of the first device 110 may be gradually brought close to the target temperature.

Herein below, a method of dynamic thermal management according to embodiments of the inventive concept will be described with reference to FIGS. 3, 12 and 15. In the following, description overlapping with embodiments previously described may be omitted for the sake of brevity.

Figure 15:
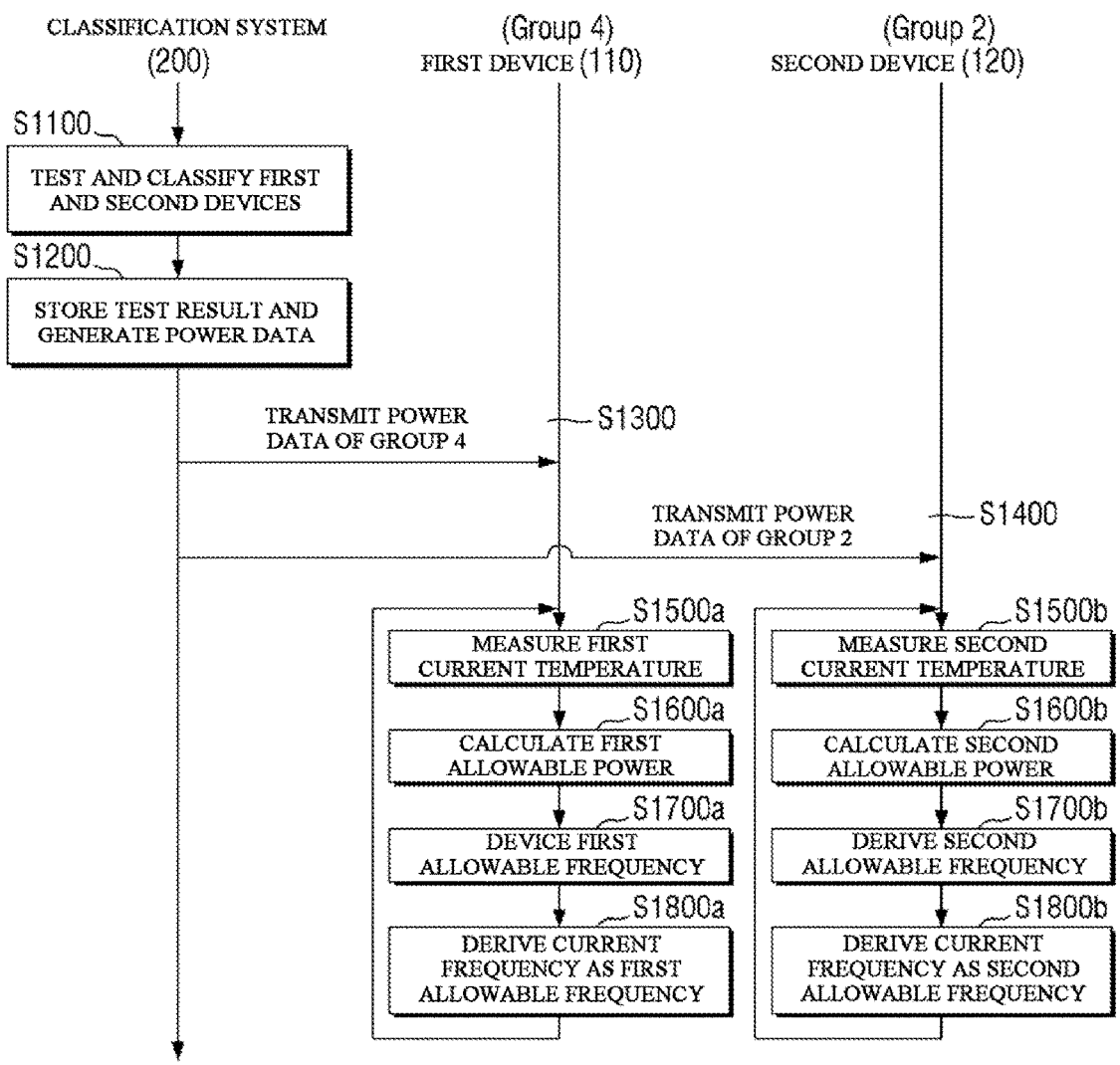
FIG. 15 illustrates a flowchart of a method of dynamic thermal management according to embodiments of the inventive concept.

FIG. 15 illustrates a flowchart of a method of dynamic thermal management according to some embodiments of the inventive concept.

Referring to FIG. 15, at S1100 the classification system 200 tests and classifies the first device 110 and the second device 120.

Specifically, referring to FIG. 3, the plurality of devices 100 may include the first device 110 and the second device 120 which perform differently with respect to each other, as described above. As will be explained below, the first device 110 and the second device 120 with different power characteristics from each other may be classified into different groups. That is, the first device 110 and the second device 120 may be a same device type, but may have different power characteristics from each other.

The classification system 200 may test power characteristics of a plurality of devices. The power characteristics may refer to respective power output of each of the plurality of devices 100 tested under a reference condition. The 'reference condition' as used herein may indicate a condition of specific frequency, for example. That is, because each of the plurality of devices 100 may have different power characteristics when operating at a same condition (i.e., at a same frequency), such power characteristics may be tested.

The classification system 200 may classify a plurality of devices 100. The classification system 200 may classify a plurality of devices into a plurality of groups using separate power characteristics of a plurality of devices 100.

Referring again back to FIG. 15, at S1200 the classification system 200 stores test results and generates the power data.

Referring to FIG. 12, the database 50 within the classification system 200 may store test results. That is, the test results indicate power outputted per device according to frequency, and may be stored in power table form such as shown in FIG. 6. However, the power table of FIG. 6 is merely one example, and the test results may be stored in a form other than a power table as shown in FIG. 6.

Referring again to FIG. 15, at S1300 the classification system 200 transmits the power data of the fourth group (Group 4) to the first device 110.

Specifically, referring to FIG. 12, the database 50 of the classification system 200 may transmit the power data of the fourth group (Group 4) of the first device 110 to the first device 110 as the First Power Data. For example, the power data of another group may be transmitted together.

Referring again to FIG. 15, at S1400 the classification system 200 transmits the power data of the second group (Group 2) to the second device 120.

Specifically, referring to FIG. 12, the database 50 of the classification system 200 may transmit the power data of the second group (Group 2) of the second device 120 to the second device 120 as the Second Power Data. For example, the power data of another group may be transmitted together.

The processes at S1300 and S1400 may be performed simultaneously or reversely. That is, the process at S1400 may be performed before the process at S1300.

Next, each of the first device 110 and the second device 120 may perform repetitive iterative methods of dynamic thermal management.

Specifically, the first device 110 may measure a first current temperature at S1500a, calculate or determine a first allowable power using the measurement at S1600a, derive a first allowable frequency using the first allowable power and a first power table at S1700a, and modify a current frequency (i.e., a current operating frequency) with the first allowable frequency at S1800a. The above processes may continue iteratively.

Likewise, the second device 120 may measure a second current temperature at S1500b, calculate or determine a second allowable power using the measurement at S1600b, derive a second allowable frequency by using the second allowable power and a second power table at S1700b, and modify a current frequency with the second allowable frequency at S1800b. The above process may also continue iteratively. In some embodiments of the inventive concept, the first allowable power and the second allowable power may for example be calculated using a same method such as methods described previously, and the second power table is different than the first power table.

For example, the first allowable power may be greater than the second allowable power. It is to be noted that the allowable power is assumed to be compared at a same temperature condition. That is, because the power characteristics of the first device 110 are superior to the power characteristics of the second device 120, such result may be derived.

Further, the first allowable frequency may be greater than the second allowable frequency. It is to be noted that the allowable frequency is assumed to be compared at a same temperature condition. That is, because the power characteristics of the first device 110 are superior to the power characteristics of the second device 120, there may be difference in the allowable power, and accordingly, there may be difference in the allowable frequency.

While the present inventive concept has been particularly shown and described with reference to exemplary embodiments thereof, it should be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of dynamic thermal management comprising:
   classifying a plurality of devices that are a same type into groups of devices according to test results of tests performed on the plurality of devices;
   storing the test results as power data for the groups of devices;
   measuring a current temperature of a first device classified in a first group among the groups of devices;
   calculating an allowable power using the current temperature;
   deriving an allowable frequency corresponding to the current temperature by using the allowable power and first power data from among the stored power data, wherein the first power data is data related to the first group to which the first device belongs, and the first power data includes power values of the first group corresponding to temperature and frequency; and modifying an operating frequency of the first device with the allowable frequency.

2. The method of claim 1, wherein the tests comprise measuring a power of the plurality of devices according to frequency.

3. The method of claim 2, wherein the measured power comprises a sum of a static power and a dynamic power,
the static power is determined using a current, a temperature and a voltage of the plurality of devices, and
the dynamic power is determined using a capacitance, the voltage, and the operating frequency of the plurality of devices.

4. The method of claim 1, wherein the groups comprise reference ranges which are different from each other, and
a test result from among the test results that corresponds to the first device is included in a reference range from among the reference ranges that corresponds to the first group.

5. The method of claim 4, wherein sizes of the reference ranges of the groups are the same.

6. The method of claim 4, wherein the groups comprise the first group having a highest test result from among the test results,
a second group having a lowest test result from among the test results, and
a third group having a test result from among the test results between the highest test result and the lowest test result, and
a size of a reference range of the third group is smaller than sizes of reference ranges of the first and second groups.

7. The method of claim 1, wherein calculating the allowable power comprises calculating the allowable power using a deviation between the current temperature and a target temperature.

8. The method of claim 7, wherein calculating the allowable power comprises calculating the allowable power by adding
a first allowable power calculated by multiplying a proportional control coefficient by the deviation, and
a second allowable power calculated by multiplying an integration value of the deviation accumulated according to time by an integral control coefficient.

9. The method of claim 7, wherein calculating the allowable power comprises calculating the allowable power by adding
a first allowable power calculated by multiplying a proportional control coefficient by the deviation, and
a third allowable power calculated by multiplying a gradient according to time of the deviation by a derivative control coefficient.

10. The method of claim 7, wherein calculating the allowable power comprises calculating the allowable power by adding
a first allowable power calculated by multiplying a proportional control coefficient by the deviation,
a second allowable power calculated by multiplying an integration value of the deviation accumulated according to time by an integral control coefficient, and
a third allowable power calculated by multiplying a gradient according to time of the deviation by a derivative control coefficient.

11. A method of dynamic thermal management comprising:

calculating an allowable power using a deviation between a current temperature of a first device and a target temperature, wherein the first device belongs to a first group among a plurality of groups which are previously classified according to power characteristics;

deriving an allowable frequency corresponding to the allowable power and the current temperature, wherein the allowable frequency is derived using previously stored data of the first group; and modifying an operating frequency of the first device with the allowable frequency, wherein the previously stored data of the first group is a power table storing power values according to frequency and the plurality of groups from a previously performed test.

12. The method of claim 11, wherein the calculating the allowable power comprises using a proportional integral (PI) control.

13. The method of claim 11, wherein the calculating the allowable power comprises using a proportional integral derivative (PID) control.

14. The method of claim 11, wherein the deriving the allowable frequency comprises designating the allowable frequency as a frequency from among the previously stored data of the first group corresponding to a power value that is smaller than the allowable power and closest to the allowable power.

15. A method of dynamic thermal management comprising:

calculating first and second allowable power respectively using a first current temperature of a first device and a second current temperature of a second device, wherein the first and second allowable power are calculated using a same method, the first and second devices are of a same device type, and the first and second devices belong to first and second groups which are different from each other;

deriving a first allowable frequency corresponding to the first allowable power using a first power table, wherein the first power table comprises frequency corresponding to power of the first device in the first group;

deriving a second allowable frequency corresponding to the second allowable power using a second power table different than the first power table, wherein the second power table comprises frequency corresponding to power of the second device in the second group; and modifying frequencies of the first and second devices with the first and second allowable frequencies, wherein the first and second groups are groups classified from a plurality of groups according to test results of tests conducted on the first and second devices.

16. The method of claim 15, wherein the first and second groups respectively comprise reference ranges which are different from each other, a test result from among the test results that corresponds to the first device is included in a reference range from among the reference ranges that corresponds to the first group, and a test result from among the test results that corresponds to the second device is included in a reference range from among the reference ranges that corresponds to the second group.

17. The method of claim 16, wherein a reference range of power from among the reference ranges corresponding to the first group is greater than a reference range of power from among the reference ranges corresponding to the second group, and the first allowable power is greater than the second allowable power.

18. The method of claim 17, wherein the first allowable frequency is greater than the second allowable frequency.

* * * * *